United States Patent
Torii

(10) Patent No.: US 6,539,530 B1
(45) Date of Patent: Mar. 25, 2003

(54) METHOD OF DESIGNING SEMICONDUCTOR INTEGRATED CIRCUIT AND SEMICONDUCTOR INTEGRATED CIRCUIT

(75) Inventor: Kensuke Torii, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/508,293

(22) PCT Filed: Jul. 9, 1999

(86) PCT No.: PCT/JP99/03727

§ 371 (c)(1),
(2), (4) Date: Jun. 13, 2000

(87) PCT Pub. No.: WO00/03434

PCT Pub. Date: Jan. 20, 2000

(30) Foreign Application Priority Data

Jul. 9, 1998  (JP) .......................... 10-194852

(51) Int. Cl.⁷ .............................. G06F 17/50
(52) U.S. Cl. .......................... 716/12; 716/14
(58) Field of Search ...................... 716/1–14

(56) References Cited

U.S. PATENT DOCUMENTS

| | | | | |
|---|---|---|---|---|
| 4,811,237 A | * | 3/1989 | Putatunda et al. | 364/491 |
| 5,824,570 A | * | 10/1998 | Aoki et al. | 438/128 |
| 5,972,740 A | * | 10/1999 | Nakamori | 438/129 |

FOREIGN PATENT DOCUMENTS

| | | |
|---|---|---|
| JP | 6-274571 | 9/1994 |
| JP | 7-271843 | 10/1995 |
| JP | 9-074139 | 3/1997 |
| WO | WO 00/03434 | 1/2000 |

* cited by examiner

Primary Examiner—Vuthe Siek
Assistant Examiner—Sun James Lin
(74) Attorney, Agent, or Firm—Hogan & Hartson, LLP

(57) ABSTRACT

A method is provided for designing a semiconductor integrated circuit having a logic macro-cell (101), a circular power source wiring (120) disposed around the logic macro-cell (101) in a ring shape and a signal wiring (150) that traverses the circular power source and is led out from the logic macro-cell to an outside. The circular power source wiring (120) is formed from a first layer Al wiring having a priority wiring direction extending in a lateral direction and a second layer Al wiring having a priority wiring direction extending in a vertical direction. The method includes: the first step of inputting in a library definitions required for automatic placing and routing; the second step of inputting the library and a net list in an automatic placing and routing apparatus; the third step of determining a placement of the logic macro-cell (101); the fourth step of determining the circuit power source wiring (120) according to the priority wiring directions; and the fifth step of determining the signal wiring (150) according to the priority wiring directions. The first step includes the step of inputting definitions for positions of vias (102–105 and 108–111) that mutually connect the first and second layer Al wirings that form the circuit power source wiring (120). The third step includes the step of designating an orientation of the logic macro-cell (101), and the step of determining which one of the first and second layers Al wirings is used to form each of the edges that compose the circular power source wiring (120) according to the designated orientation and the priority wiring directions.

12 Claims, 9 Drawing Sheets

METHOD OF DESIGNING SEMICONDUCTOR INTEGRATED CIRCUIT AND SEMICONDUCTOR INTEGRATED CIRCUIT

FIELD OF THE INVENTION

The present invention mainly relates to a method for designing a standard-cell type semiconductor integrated circuit and a standard-cell type semiconductor integrated circuit. More particularly, the present invention relates to a placement and routing method to be employed when a logic macro-cell registered in a library is optionally rotated for placement and power source lines are circularly disposed around the logic macro-cell.

A standard cell is one type of ASIC (Application Specific Integrated Circuit) cell. A standard cell is an application specific IC that is manufactured by using logic macro-cells which are registered in a library. Logic macro-cells refer to those ranging from basic blocks, such as NAND gates, NOR gates, inverters, flip-flops, counters, adders, decoders, multiplexers and the like to high performance blocks, such as CPU cores that implement these basic blocks, memory blocks such as RAMs and ROMs and the like. A semiconductor integrated circuit realizes required functions by inputting and outputting signals through the respective logic macro-cells.

A standard cell system enables a design with stress being placed on characteristics of logic macro-cells, unlike a gate array system. Also, due to a high degree of freedom in the layout of logic macro-cells, a higher integration and a smaller chip size can be achieved by placing them with a high level of integration density.

Logic macro-cells used in standard cells include those that occupy relatively large areas. Power source wirings may be circularly placed around such a logic macro-cell (for example, see Japanese Laid-open Patent Application SHO62-145835).

In recent years, semiconductor apparatuses have multiple metal wiring layers ranging from 2 layers to 6 layers. Metal wiring layers are used to provide connections to power source wirings that supply power source potentials VDD and VSS, within logic macro-cells, between logic macro-cells and between terminals of logic macro-cells and the power source wirings.

In general, aluminum layers are used as wiring layers. For example, a two-layer metal wiring includes a first Al wiring layer and a second Al wiring layer. When wiring routs for the first Al wiring layer and the second Al wiring layer are determined by an automatic placing and routing apparatus, priority wiring directions are allocated to the respective first and second Al wiring layers. This will be described below with reference to FIG. 8.

FIG. 8 shows a routing diagram for a logic macro-cell having circularly placed power source wirings. FIG. 8 shows, for example, a rectangular logic macro-cell region 400 that is composed of a plurality of basic cells connected with one another. A circular power source wiring layer 401 is formed around the rectangular logic macro-cell region 400. The circular power source wiring layer 401 includes an inside power source wiring 402 that supplies, for example, a power source potential VSS, and an outside power source wiring 403 that supplies, for example, a power source potential VDD.

Also, power supply wirings 404–407 are provided for supplying power from the inside and outside power source wirings 402 and 403 to the logic macro-cell region 400.

It is noted that the wirings 402–407 are formed according to predetermined priority wiring directions. In this example, the wirings in a lateral direction in FIG. 8 are formed by the first Al layer, and the wirings in a vertical direction in FIG. 8 are formed by the second Al layer.

Accordingly, the inside metal wiring 402 includes first layer Al wirings 408 and 409 in the lateral direction and second layer Al wirings 410 and 411 in the vertical direction and vias 412–415 at four corners thereof for connecting the wirings 408–411 to one another.

In a similar manner, the outside metal wiring 403 includes first layer Al wirings 416 and 417 extending in the lateral direction and second layer Al wirings 418 and 419 extending in the vertical direction and vias 420–423 at four corners thereof for connecting the wirings 416–419 to one another.

The power supply wirings 404–407 are formed with the second layer Al wirings, and connected to the first layer Al wirings 408, 409, 416 and 417, respectively, through vias 424–427.

A signal wiring 430 is led from the logic macro-cell region 400 to an outside of the inside and outside power source wirings 402 and 403. When the wiring 430 is formed, for example, along the lateral direction in FIG. 8, the wiring 430 is formed with the first layer Al wiring.

With the structure described above, the power supply wirings 404–407 are connected to the inside and outside power source wirings 402 and 403. In particular, the power supply wirings 406 and 407 are connected to the outside power source wiring 403 without being obstructed by the inside power source wiring 402.

In the case of the above-described standard cell, when logic macro-cells pre-registered in a library are placed when designing an IC, identical logic macro-cells may be disposed in different orientations in different chips or within one chip (see Japanese Laid-open Patent Application HEI 4-94556). For example, with respect to the logic macro-cell region 400 shown in FIG. 8, a logic macro-cell region 500 shown in FIG. 9 is rotated clockwise through 90 degrees for placement.

A circular power source wiring layer 501 shown in FIG. 9 also includes an inside power source wiring 502 and an outside power source wiring 503. Priority wiring directions of wirings 508–511 and 516–519 that respectively form the inside power source wiring and the outside power source wiring 502 and 503 and power supply wirings 604–507 are reversed with respect to those of the wirings 408–411, 416–419 and 404–407 shown in FIG. 8.

More specifically, the first layer Al wiring extends in the lateral direction in FIG. 8 and the second layer Al wiring extends in the vertical direction in FIG. 8. In contrast, the second layer Al wiring extends in the lateral direction in FIG. 9 and the first layer Al wiring extends in the vertical direction in FIG. 9. In other words, the wirings 504–507 shown in FIG. 9 are also rotated clockwise through 90 degrees with respect to the wirings 404–407 shown in FIG. 8. With this structure, the data for the logic macro-cell region 400 shown in FIG. 8 can be used for the logic macro-cell region 500 shown in FIG. 9 as it is. It is noted that the power source wirings 508–511 and 516–519 are connected in a ring shape by vias 512–515 and 520–523.

It is noted that the above-described implementation is an exceptional one, and logic macro-cells other than the logic macro-cell region 500 have first layer and second layer Al wirings that are provided in accordance with the normal priority wiring directions.

However, a signal wiring 530 that is led from the logic macro-cell region 500 to an outside of the inside and outside power source wirings 502 and 503 shown in FIG. 9 cannot be formed only with the first layer Al wiring, unlike the signal wiring 430 shown in FIG. 8. If the signal wiring 530 is to be led in the vertical direction of FIG. 9 only with the first Al wiring, the signal wiring 530 would make a short circuit in a logic macro-cell to which the signal wiring 530 extends with a signal wiring or a power source wiring that is formed therein with a first Al wiring extending in the lateral direction. Alternatively, if the signal wiring 530 extending in the vertical direction is to be made only with the second layer Al wiring in a normal manner, the signal wiring 530 makes a short circuit with the power source second layer Al wirings 511 and 519.

As a countermeasure, the signal wiring 530 needs to be provided with a region formed with a first layer Al wiring 531 that passes over the power source second layer Al wirings 511 and 519, as shown in FIG. 9. Both ends of the region need to be connected to the second layer Al wirings 534 and 535 through vias 532 and 533.

Such a countermeasure is required not only for the signal wiring 530 but also for all the wirings that traverse the circular power source wirings 502 and 503.

By implementing such a countermeasure, regions for providing vias are required such that wirings can pass over the circular power source wirings 502 and 503. This results in a greater cell area.

Also, if exceptional wirings of this type are to be conducted by an automatic placing and routing apparatus, the number of definitions for "obstacles" in a library increases. As a result, the software operating time may increase.

Also, in the case of the example shown in FIG. 9, if the circular power source wirings 508–511 and 516–519 and the power supply wirings 504–507 are to be formed along the priority wiring directions, definitions that are completely different from those for the example shown in FIG. 8 would have to be inputted in an automatic placing and routing apparatus. As a consequence, the registration of definitions in a library becomes extremely complicated.

Accordingly, it is an object of the present invention to provide a method for designing a semiconductor integrated circuit in which, even when logic macro-cells are placed in a plurality of different orientations, a plurality of wiring layers that form circular power source wirings and power supply wirings can be determined along their priority wiring directions, and the registration of definitions in a library is readily made. It is also an object of the present invention to provide a semiconductor integrated circuit manufactured by the method.

SUMMARY OF THE PREFERRED EMBODIMENTS

In accordance with aspects of the present invention, a method for designing a semiconductor integrated circuit having a logic macro-cell, a circular power source wiring disposed around the logic macro-cell in a ring shape and a signal wiring that traverses the circular power source wiring and is led out from the logic macro-cell to an outside, wherein at least the circular power source wiring is formed from a plurality of wiring layers, and priority wiring directions for the plurality of wiring layers are specified for each of the layers.

Such methods can include:
the first step of inputting in a library definitions required for automatic placing and routing;
the second step of inputting the library and net lists defining connections between the logic macro-cell and other logic macro-cells in an automatic placing and routing apparatus;
the third step of determining a placement of the logic macro-cell;
the fourth step of determining the circuit power source wiring according to the priority wiring directions; and
thereafter, the fifth step of determining the signal wiring according to the priority wiring directions.

In accordance with one embodiment of the present invention, the first step includes the step of inputting definitions for positions of vias that mutually connect the plurality of wiring layers that form the circular power source wiring. Further, the third step includes the step of designating an orientation of the logic macro-cell, and the step of determining which one of the plurality of wiring layers is used to form each of the edges that compose the circular power source wiring according to the designated orientation and the priority wiring directions.

In accordance with the above-described embodiment, the first step does not define which one of the plurality of wiring layers is used for each of the edges of the circular power source wiring or the orientation of the logic macro-cell. The orientation of the logic macro-cell is designated in the third step. Which one of the plurality of wiring layers is to be used for each of the edges of the circular power source wiring is determined according to the priority wiring directions in the fourth step that is performed after the third step in which the orientations of the logic macro-cell is designated.

In accordance with another embodiment, the first step includes the step of inputting in a library a definition indicating that the circular power source wiring can use any one of the plurality of wring layers, and the step of inputting definitions in a library for positions of vias that mutually connect the plurality of wiring layers that form the circular power source wing. Furthermore, the third step includes the step of designating an orientation of the logic macro-cell, and the step of deciding, according to the designated orientation and the priority wiring directions, to form each of the edges that form the circular power source wiring with a selected wiring layer among the determined plurality of wiring layers.

In the above-described another embodiment, the orientation of the logic macro-cell is not determined in the first step. The orientation of the logic macro-cell is determined in the third step. Also, in the first step, a definition indicating that the circular power source wiring can use any one of the plurality of wiring layers is inputted. Accordingly, in the fourth step that is performed after the orientation of the logic macro-cell is designated, a determination can be made such that one of the plurality of wiring layers is selected and each of the edges that form the circular power source wiring can be formed according to the designated orientation of the logic macro-cell and the priority wiring directions.

In any one of the above-described embodiments, the first step may include the step of inputting definitions in a library for positions of vias that connect the circular power source wiring to a power supply wiring that supplies power from the circular power source wiring to the logic macro-cell. In this case, in the third step, in accordance with the designated orientation of the logic macro-cell and the priority wiring directions, a determination is made as to which one of the plurality of wiring layers can be used to form the power source wiring.

In accordance with still another embodiment, a semiconductor integrated circuit has first and second logic macro-cells having the same function and the same configuration, first and second circular power source wirings disposed respectively around the first and second logic macro-cells, and first and second signal wirings that are externally lead out from the respective first and second logic macro-cells and respectively transverse the first and second circular power source wings. The first and second circular power source wirings are formed from a plurality of wiring layers in which priority wiring directions are specified for each of the wiring layers.

In the above embodiment, the second logic macro-cell is disposed in an orientation different than that of the first logic macro-cell. However, all of the plurality of wiring layers that form the first and second circular power source wirings and the first and second signal lines are routed according to the priority wiring directions.

As a result, the signal wirings that traverse the circular power source wirings do not require taking a detour through the use of vias and two wiring layers.

The semiconductor integrated circuit includes first and second power supply wirings that respectively supply power from the first and second circular power source wirings to the first and second logic macro-cells. All of the first and second power supply wirings can be routed according to the priority wiring directions.

EMBODIMENTS OF THE INVENTION

Embodiments of the present invention will be described below with reference to the accompanying drawings.

Figure 1:
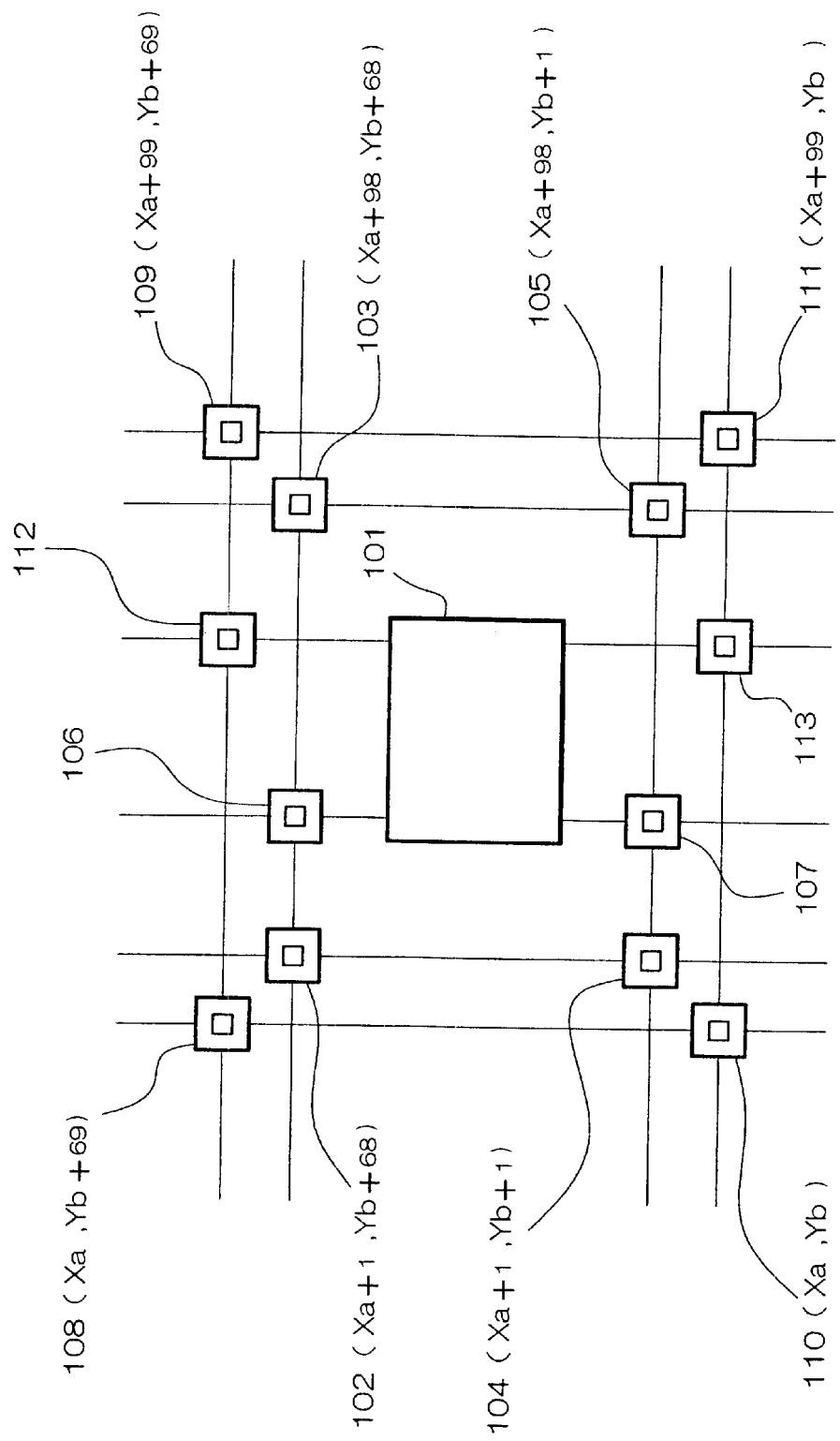
FIG. 1 is a schematical illustration of definitions for positions of vias of circular power source wirings used for designing a semiconductor integrated circuit in accordance with a first embodiment of the present invention.
Figure 2:
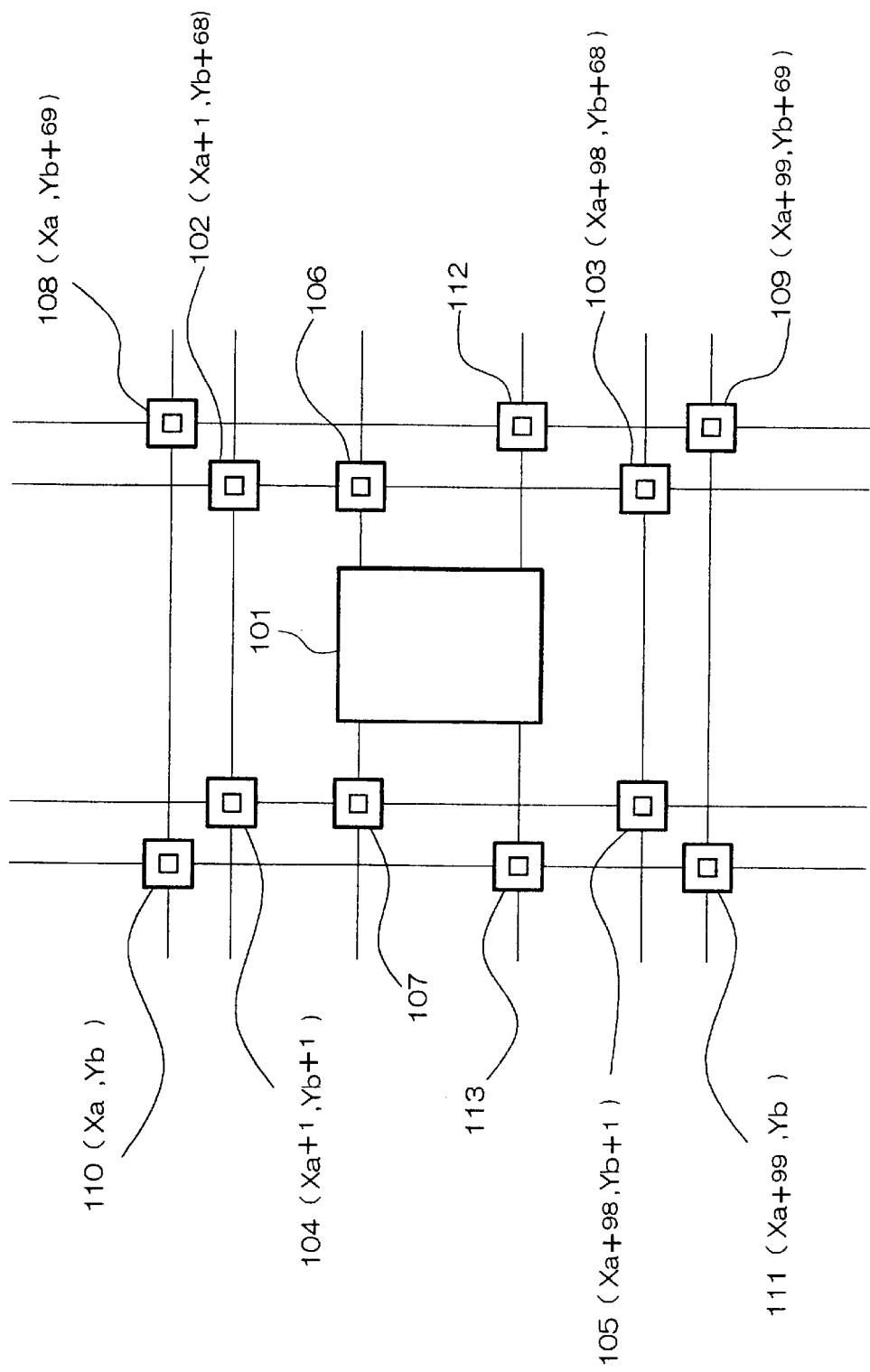
FIG. 2 is a schematical illustration of identical definitions for positions of the vias shown in FIG. 1 which are rotated clockwise through 90 degrees with respect to the positions shown in FIG. 1.

FIGS. 1 and 2 are schematical illustrations of definitions for the positions of vias 102–113 of inside and outside power source wiring layers with respect to a logic macro-cell 101. FIG. 1 shows the logic macro-cell 101 that is disposed with its longer edges being oriented in the lateral direction. FIG. 2 shows the logic macro-cell 101 that is disposed with its longer edges being oriented in the vertical direction. The definitions for the positions of the vias define the positions of the vias shown in both FIG. 1 and FIG. 2. In other words, the positions of the vias are defined without regard to the disposed orientation of the logic macro-cell 101.

With respect to the logic macro-cell 101 and the vias 102–113 shown in FIG. 1, the logic macro-cell 101 and the vias 102–113 shown in FIG. 2 are rotated clockwise through 90 degrees. However, the vias 102–113 that are shown in FIG. 1 and FIG. 2 are defined by the same coordinates. In FIG. 1 and FIG. 2, a region encircled by the vias 108–111 has a size of 100×70 on a lattice grid.

The coordinates shown in FIGS. 1 and 2 are relative coordinates on a lattice grid with respect to the logic macro-cell 101, and are different from absolute coordinates on a lattice grid (which will be described below with reference to FIG. 3) with respect to an IC chip.

Using the definitions, an automatic placing and routing apparatus performs steps for placing and routing of each logic macro-cell in a semiconductor integrated circuit. The steps will be described with reference to a flow chart shown in FIG. 5.

First, definitions for positions of all pins (including contact holes, vias and external terminals) including the vias 102–113 and definitions for logic macro-cells to be used are registered in a library (step 1). The library is inputted in an automatic placing and routing apparatus (step 2). Further, a net list that defines connections among logic macro-cells is inputted in the automatic placing and routing apparatus (step 3). Then, placement of all the logic macro-cells including the logic macro-cell 101 that are mounted on an IC chip is determined according to a placement program (step 4). In this instance, the placement orientation of the logic macro-cell 101 is designated. The designation can be carried out by inputting data through an input unit. Alternatively, the inputted designation data may be pre-stored in a storage unit, and the stored data may be read out to designate the orientation of the logic macro-cell 101 at the time of routing. What is important is that the designation of the orientation of the logic macro-cell 101 is not included in the definitions of the library, but it can be done before the step of determining the circular power source wirings (step 5).

The placement of all the logic macro-cell in step 4 is performed after performing a rough routing evaluation. For example, the entire chip may be divided into several segments, and the sum of occasions in which designed wirings transverse the segments is obtained. The logic macro-cells are placed so that the sum becomes least.

Then, wiring routs are determined. First, the circular power source wirings and power supply wirings that supply power to the logic macro-cell that is disposed within the circular power source wirings are determined (step 5). Lastly, signal wirings within the logic macro-cells, signal wirings between the logic macro-cells and the remaining power source wirings and power supply wirings are determined according to the wiring program (step 6). The automatic routing in step 5 and step 6 is performed according to priority wiring directions that are defined for each of the layers.

Figure 3:
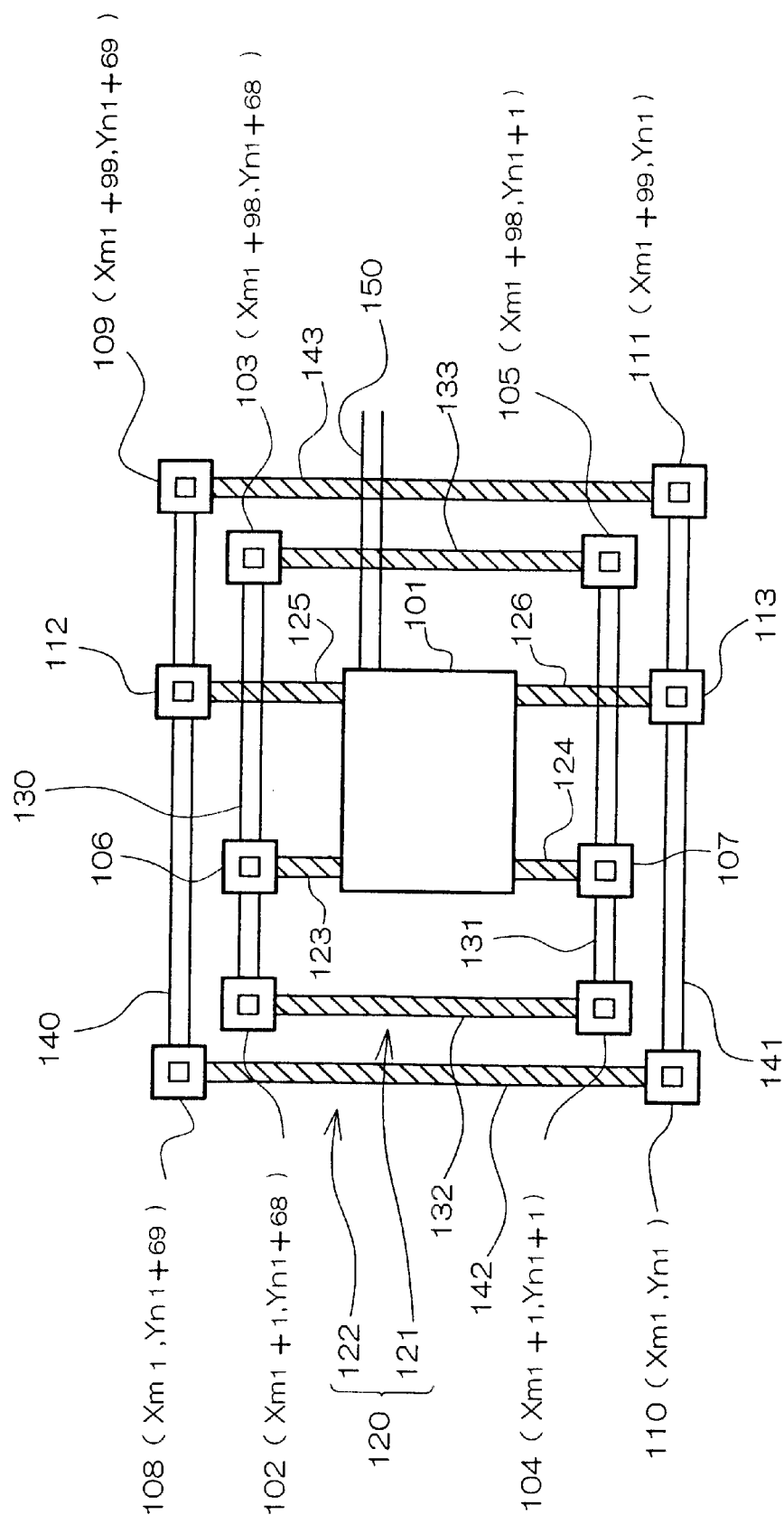
FIG. 3 is a circuit diagram of a logic macro-cell in which automatic placing and routing are performed based on the definitions for positions of vias that are common in FIGS. 1 and 2.
Figure 4:
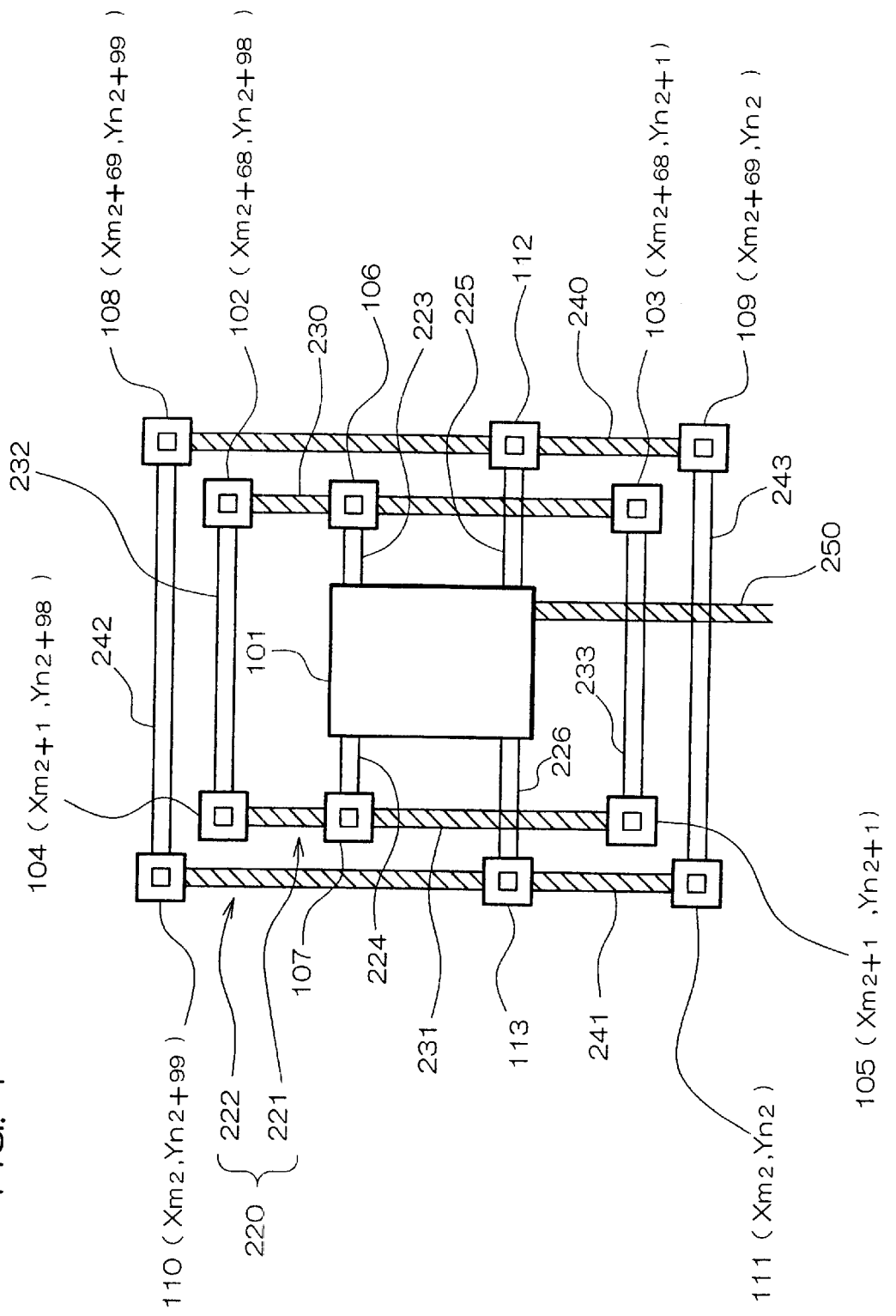
FIG. 4 is another circuit diagram of a logic macro-cell in which automatic placing and routing are performed based on the definitions for positions of vias that are common in FIGS. 1 and 2, and the positions are rotated through 90 degrees with respect to those shown in FIG. 3.

FIGS. 3 and 4 show two types of placing and routing results obtained in a manner described above for the logic macro-cell 101.

FIG. 3 shows a semiconductor integrated circuit in which the logic macro-cell 101 is disposed according to the normal manner. In contrast, in another semiconductor integrated circuit shown in FIG. 4, the logic macro-cell 101 is disposed after rotating clockwise through 90 degrees with respect to the position of the logic macro-cell 101 shown in FIG. 3.

Referring to FIG. 3, a circular power source wiring layer 120 is formed around the logic macro-cell region 101 that is composed of a plurality of connected basic cells and that is in a rectangular shape, for example. The circular power source wiring layer 120 includes an inside power source wiring 121 that supplies, for example, a power source potential VSS, and an outside power source wiring 122 that supplies, for example, a power source potential VDD.

Also, power source wirings 123–126 are provided to supply power from the respective inside and outside power source wirings 121 and 122 to the logic macro-cell region 101.

The wirings 121–126 are formed according to the predetermined priority wiring directions. In this embodiment, the wirings extending in the lateral direction in FIG. 3 are formed with a first layer Aluminum, and the wirings extending in the vertical direction in FIG. 3 are formed with a second layer Aluminum.

Accordingly, the inside metal wiring 121 includes first layer Al wirings 130 and 131 extending in the lateral direction, second layer Al wirings 132 and 133 extending in the vertical direction and vias 102–105 at four corners thereof that mutually connect the wirings 130–133.

Similarly, the outside metal wiring 122 includes first layer Al wirings 140 and 141 extending in the lateral direction, second layer Al wirings 142 and 143 extending in the vertical direction and vias 108–111 at four corners thereof that mutually connect the wirings 140–143.

Also, each of the power supply wirings 123–126 is formed with the second layer Al wiring. The power supply wirings 123–126 are respectively connected to the first layer Al wirings 130, 131, 140 and 141 through the vias 106, 107, 112 and 113, respectively.

Further, a signal wiring 150 is led out from-the logic macro-cell 101 to an area external to the inside and outside power source wirings 121 and 122. When the wiring 150 is formed along, for example, the lateral direction in FIG. 3, the wiring 150 is formed with the first layer Al wiring.

As a result, the power supply wirings 123–126 are connected to the inside and outside power source wirings 121 and 122. In particular, the power supply wirings 125 and 126 are connected to the outside power source wiring 122 without being obstructed by the inside power source wiring 121. Also, the signal wiring 150 is led out to an area external to the inside and outside power source wirings 121 and 122 without being obstructed by the inside and outside power source wirings 121 and 122.

Coordinates shown in FIG. 3 are absolute coordinates on a lattice grid with respect to an IC chip. For example, let us assume that a rectangular area defined by the vias 108–111 has a size of 100×70 on a lattice grid. When the via 110 is located at coordinates (Xm1, Yn1), coordinates of the vias 108, 109 and 111 are respectively (Xm1, Yn1+69), (Xm1+99, Yn1+69) and (Xm1+99, Yn1). Also, coordinates of the vias 102–105 are respectively (Xm1+1, Yn1+68), (Xm1+98, Yn1+68), (Xm1+1, Yn1+1) and (Xm1+98, Yn1+1).

On the other hand, the circular power source wiring 220 shown in FIG. 4 has inside and outside power source wirings 221 and 222. The inside power source wiring 221 is formed with first layer Al wirings 232, 233 and second layer Al wirings 230, 231, and the outside power source wiring 222 is formed with second layer Al wirings 240, 241 and first layer Al wirings 242 and 243. Power supply wirings 223–226 are formed with the first layer Al wirings. The power supply wirings 223–226 and the power source wirings 230–233 and 240–243 are set in the same priority wiring directions as those of the corresponding wirings 123–126, 130–133 w and 140–143 shown in FIG. 3.

In other words, in FIG. 3 and FIG. 4, the first layer Al wirings extend in the lateral direction, and the second layer Al wirings extend in the vertical direction. Stated otherwise, the logic macro-cell 101 and the vias 102–113 shown in FIG. 4 are rotated clockwise through 90 degrees with respect to those shown in FIG. 3. However, the wirings in each layer are routed in accordance with the principle priority wiring directions.

A signal wiring 250 is formed only with a second layer Al wiring, and is led out without being obstructed by the first layer Al wirings 233 and 243 which are power source wirings extending in the lateral direction.

It is noted that the coordinates shown in FIG. 4 are absolute coordinates on a lattice grid with respect to an IC chip. More specifically, when the via 111 has coordinates (Xm2, Yn2), coordinates of the vias 108, 109 and 110 are respectively (Xm2+69, Yn2+99), (Xm2+69, Yn2) and (Xm2, Yn2+99). Also, coordinates of the vias 102–105 are respectively (Xm2+68, Yn2+98), (Xn2+68, Ym2+1), (Xm2+1, Yn2+98) and (Xm2+1, Yn2+1).

Figure 5:
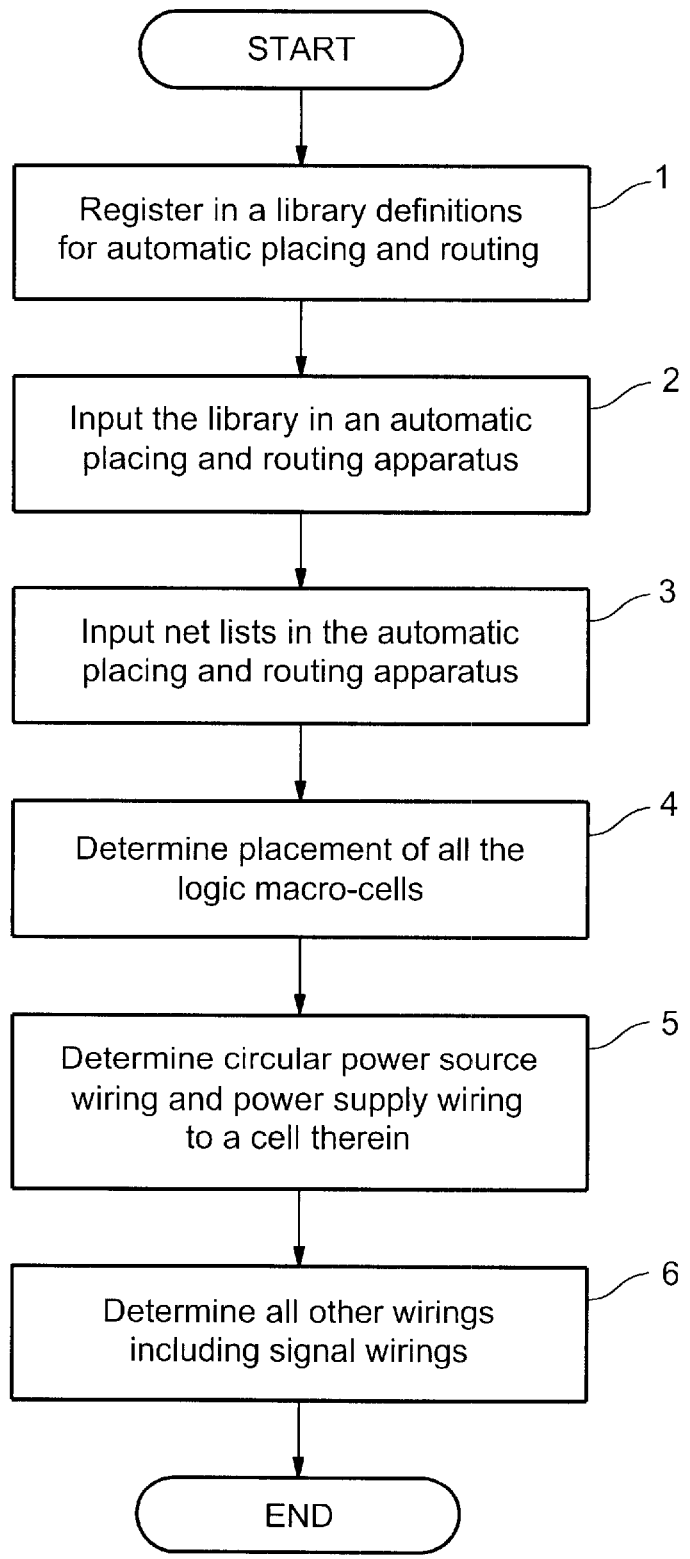
FIG. 5 shows a flow chart of automatic placing and routing steps.

One example of the definitions registered in a library performed in step 1 shown in FIG. 5 is shown below in Table 1.

TABLE 1

| Logic Macro-cell | PIN | Wiring | Obstacle |
|---|---|---|---|
| Name RAM 1 | Name PVDD1 | Name Circular power source wiring | None |
| Direction Undesignated | Coordinates Xa, Yb | Layer Undesignated | |
| | Name PVDD2 | Name Power supply wiring | |
| | Coordinates Xa, Xb + 69 | Layer Undesignated | |
| | Name PVSS1 | Name Signal wiring | |
| | Coordinates Xa + 1, Xb + 1 | Layer Undesignated | |
| | Name PVSS2 | | |
| | Coordinates Xa + 1, Yb + 68 | | |

As shown in Table 1, the orientation of the logic macro-cell is not defined. This is because it is designated in step 4 shown in FIG. 5. It is noted that, although the coordinates of vias are defined, no definition is provided as to which one of the first Al layer and the second Al layer is used to form each segment of the circular power source wiring and the power supply wiring. This is because they are determined in step 5 shown in FIG. 5.

A method for designing a semiconductor integrated circuit in accordance with a second embodiment of the present invention will be described below with reference to FIG. 6.

Figure 6:
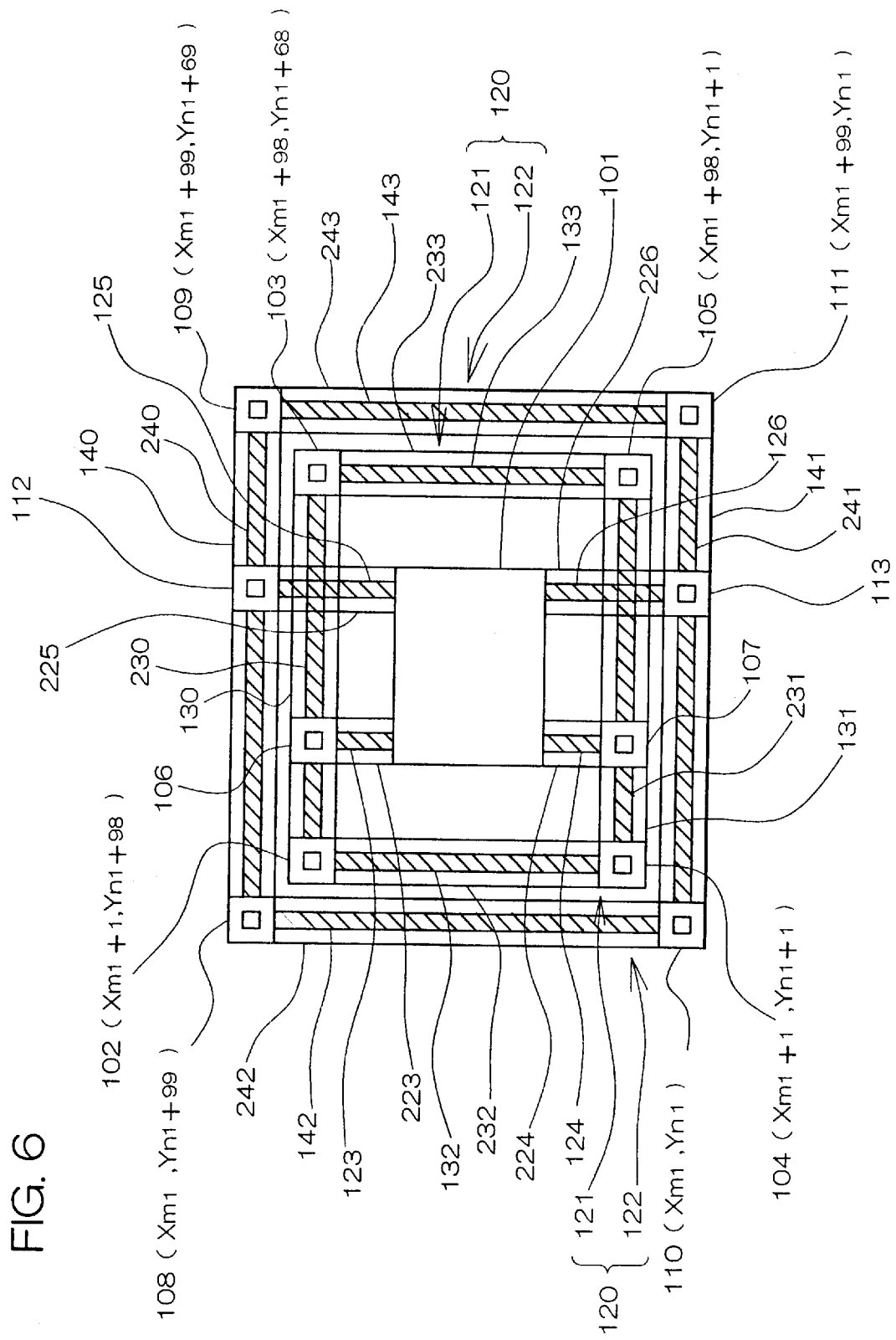
FIG. 6 is a schematical illustration of circular power source wirings and definitions for positions of vias thereof used for designing a semiconductor integrated circuit in accordance with a second embodiment of the present invention.

FIG. 6 is an illustrative presentation of definitions for positions of a logic macro-cell, circuit power source wirings and vias thereof.

In FIG. 6, positions of the vias 102–113 are provided with the same definitions as those shown in FIGS. 3 and 4. Further, in FIG. 6, layers for forming a circular power source wiring 120 are also defined.

The circular power source wiring 120 includes inside and outside power source wirings 121 and 122, as shown in FIG.

6. Each of the wirings that form the inside and outside power source wirings 121 and 122 is defined by a pair of a first layer Al wiring and a second layer Al wiring (130, 230), (131, 231), (140, 240), (141, 241), (232, 132), (233, 133), (242, 142) and (243, 143). Similarly, each of the power supply wirings is defined by a pair of a first layer Al wiring and a second layer Al wiring (223, 123), (224, 124), (225, 125) and (226, 126).

In FIG. 6, the line width of the first layer Al wirings 180, 131, 140, 141, 232, 233, 242, and 243 is shown to be greater than the line width of the second layer Al wirings 230, 231, 240, 241, 132, 133, 142, and 143 only for the convenience of illustration. However, in effect, they have the same line width.

Definitions for the logic macro-cell and the other elements shown in FIG. 6 are shown below in Table 2.

TABLE 2

| Logic Macro-cell | PIN | Wiring | Obstacle |
|---|---|---|---|
| Name RAM 1 Direction Undesignated | Name PVDD1 Coordinates Xa, Yb Name PVDD2 Coordinates Xa, Xb + 69 Name PVSS1 Coordinates Xa + 1, Xb + 1 Name PVSS2 Coordinates Xa + 1, Yb + 68 | Name PVDD1–PVDD2 Layer AL1 or AL2 Name PVDD2–PVDD3 Layer AL1 or AL2 Name PVSS1–PVSS2 Layer AL1 or AL2 Name PVSS2–PVSS3 Layer AL1 or AL2 | None |

As shown in Table 2, power source wirings are defined, unlike Table 1. However, the power source wirings are defined such that each of them can be selected between the first layer Al wiring and the second layer Al wiring.

Such definitions are inputted in an automatic placing and routing apparatus in step 1 and step 2 shown in FIG. 5. Further, after step 3 shown in FIG. 5, the orientation of the logic macro-cell 101 is designated in step 4, and placement of all of the logic macro-cells are set. Then, when the routing of the circular power source wiring 120 is decided in step 5, a determination is made as to which one of the first Al wiring layer and the second Al wiring layer is used to form each of the wirings that form the inside and outside power source wirings 121 and 122 in accordance with the orientation of the logic macro-cell 101 and in accordance with the priority wiring directions. Then, routing of all the remaining wirings including the signal wirings is decided in step 6.

Placing and routing results are thus obtained. When the logic macro-cell 101 is oriented in the normal manner, the placing and routing result shown in FIG. 3 is obtained. When the logic macro-cell 101 is rotated clockwise through 90 degrees with respect to the placement shown in FIG. 3, the placing and routing result shown in FIG. 4 is obtained.

In this manner, in accordance with the second embodiment, the circular power source wiring and the power supply wirings can also be routed according to the priority wiring directions without regard to the orientation of the logic macro-cell 101.

In accordance with the embodiments described above, wirings are implemented according to the priority wiring directions even when identical logic macro-cells are disposed in different orientations within an IC chip.

Figure 7:
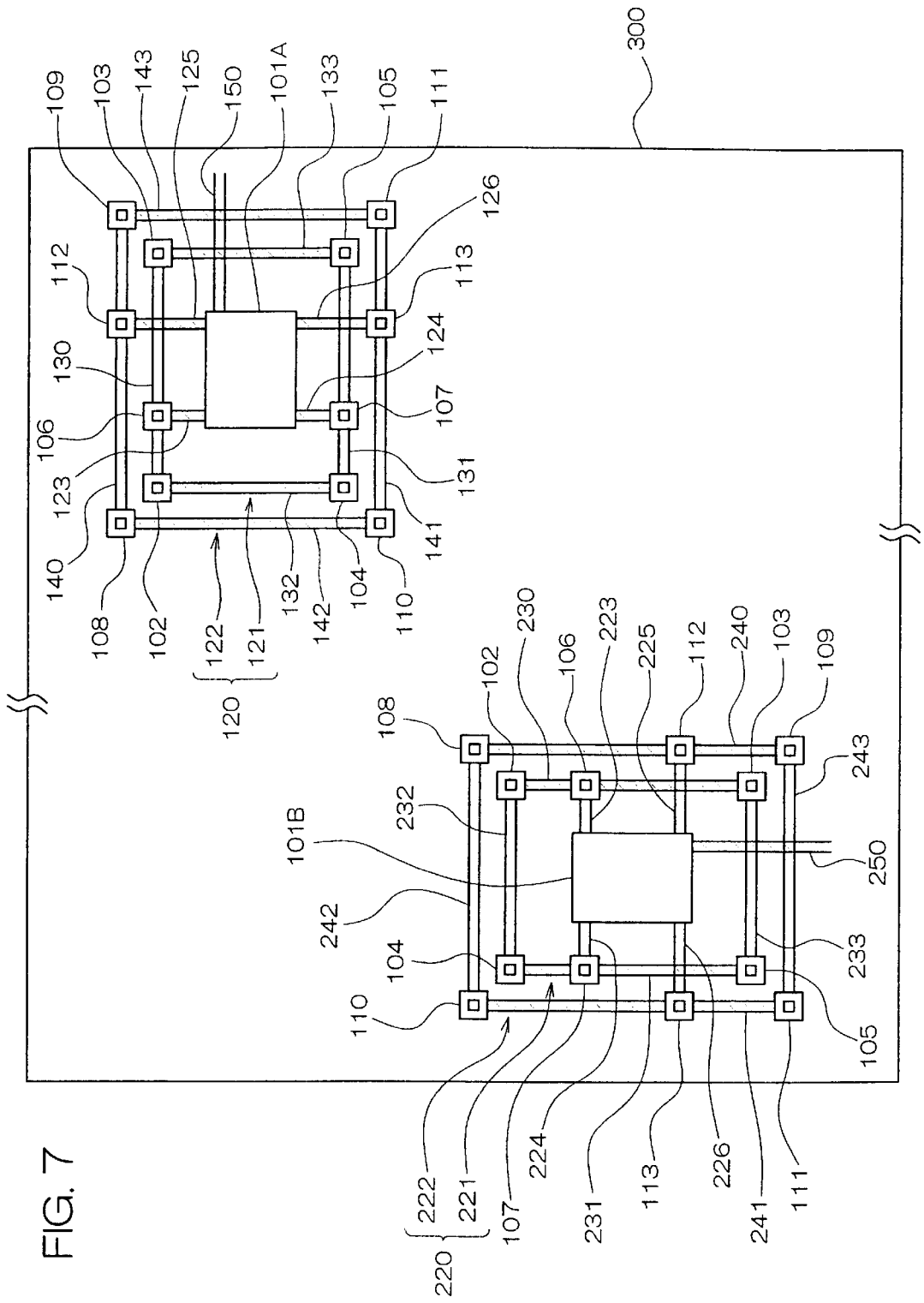
FIG. 7 is a circuit diagram of a semiconductor integrated circuit in accordance with a third embodiment of the present invention.
Figure 8:
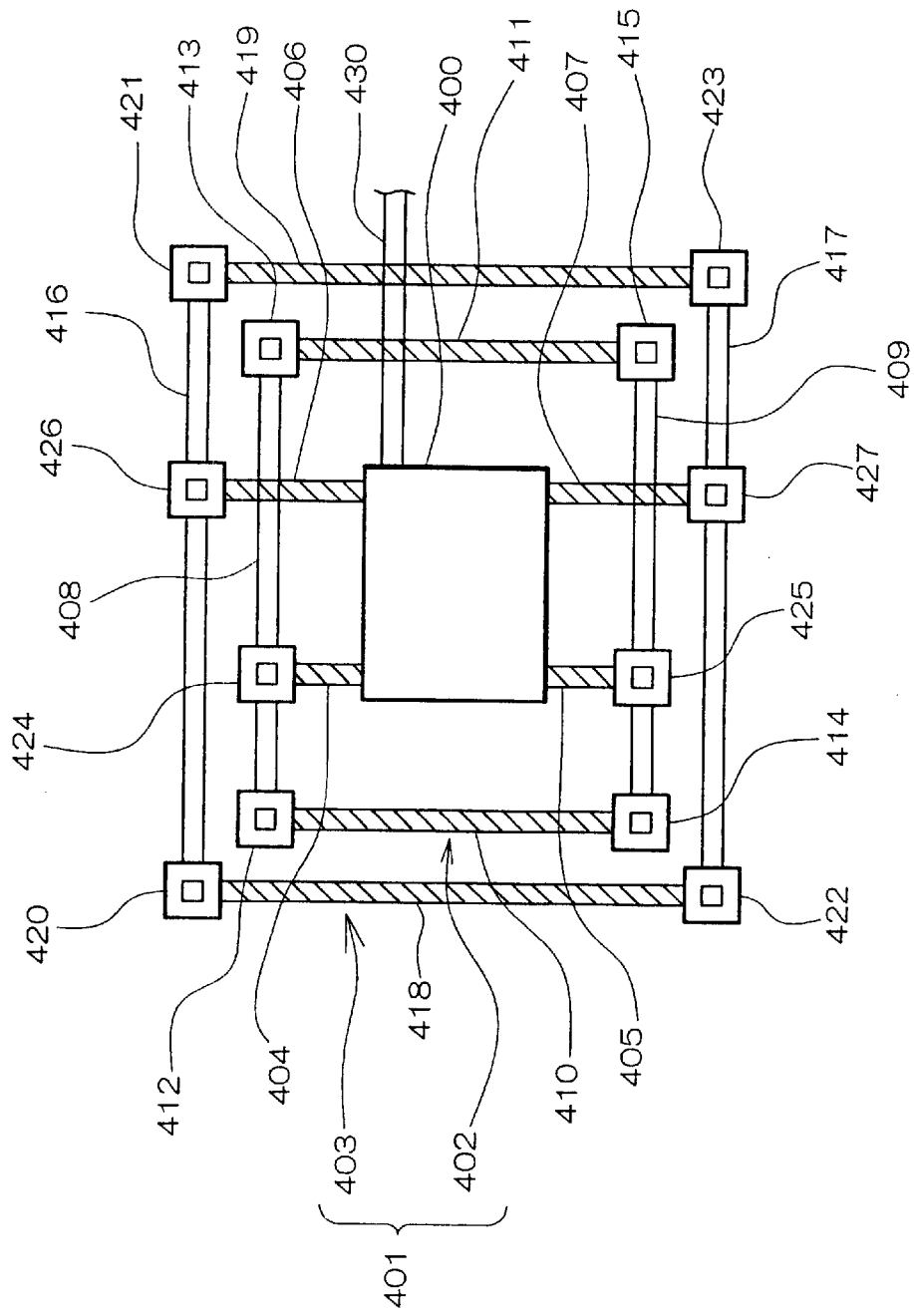
FIG. 8 shows a circuit diagram of a conventional circuit in which power source wirings are disposed around a logic macro-cell along priority wiring directions which are different from the vertical direction to the lateral direction.
Figure 9:
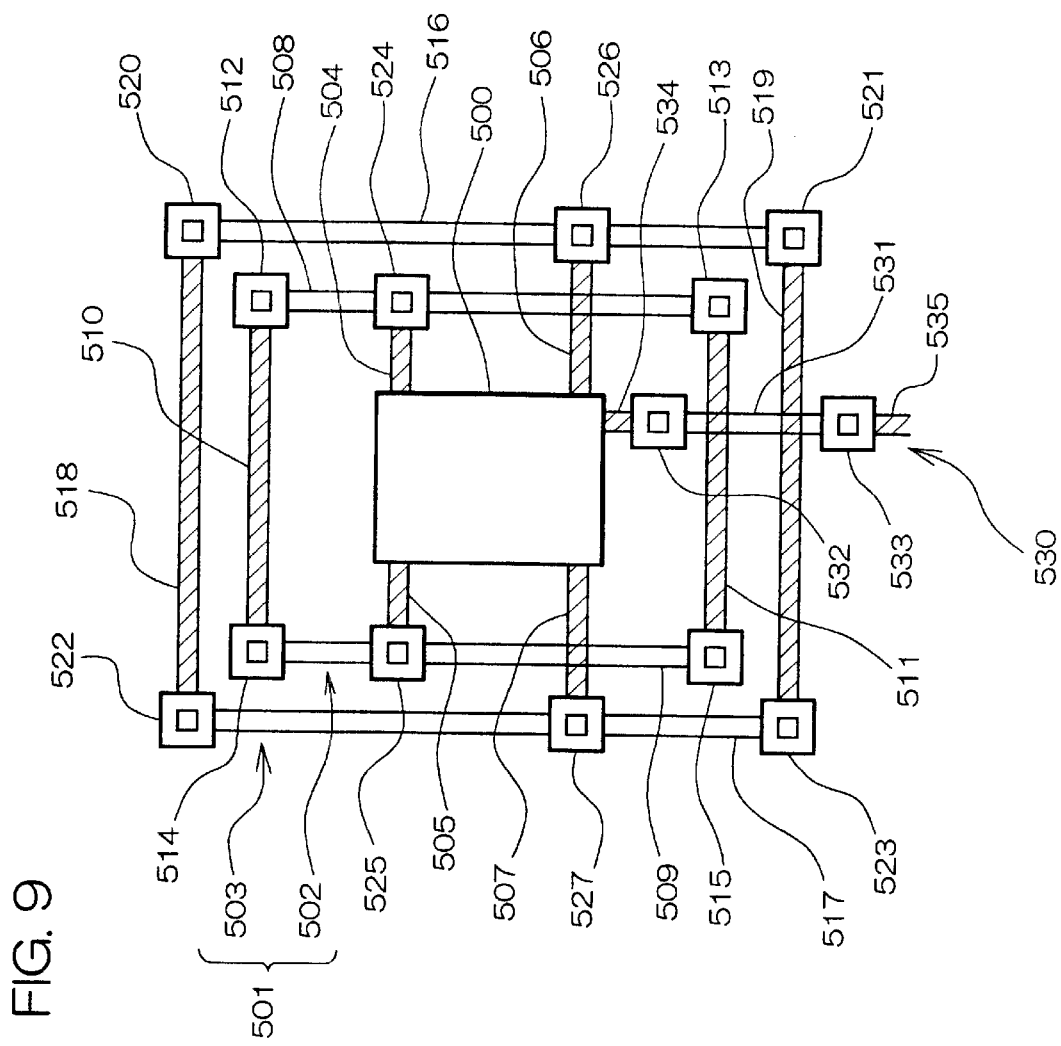
FIG. 9 shows a circuit diagram of a conventional circuit in which the logic macro-cell and the power source wirings shown in FIG. 8 are rotated clockwise through 90 degrees.

FIG. 7 shows the state in which two logic macro-cells, 101A and 101B having the same function are disposed and routed within an IC chip 300.

In the above embodiment, wirings of the two logic macro-cells 101A and 101B, and the circuit power source wirings and power supply wirings therefore are defined as shown in Table 3 below.

TABLE 3

| Logic Macro-cell | PIN | Wiring | Obstacle |
|---|---|---|---|
| Name RAM 1 Direction Undesignated | Name PVDD1 Coordinates Xa, Yb Name PVDD2 Coordinates Xa, Xb + 69 Name PVSS1 Coordinates Xa + 1, Xb + 1 Name PVSS2 Coordinates Xa + 1, Yb + 68 | Name Circular power source wiring Layer Undesignated Name Power supply wiring Layer Undesignated | None |
| Name RAM 2 Direction Undesignated | Name PVDD1 Coordinates Xa, Yb Name PVDD2 Coordinates Xa, Xb + 69 Name PVSS1 Coordinates Xa + 1, Xb + 1 Name PVSS2 Coordinates Xa + 1, Yb + 68 | Name Circular power source wiring Layer Undesignated Name Power supply wiring Layer Undesignated | None |

As shown in Table 3, the same definitions may be set for the two logic macro-cells 101A and 101B and the circular power source wirings and the power supply wirings therefore except their names.

It is noted that the present invention is not limited to the first through the third embodiments, and a variety of modifications may be made within the scope of the subject matter of the present invention. For example, when a logic macro-cell is set in a different orientation, orientations other than the orientation in which logic macro-cell is rotated clockwise through 90 degrees can be set.

Further, in the first through the third embodiments, two wiring layers are used. However, the present invention is also applicable to a structure that has three or more wiring layers in which priority wiring directions are specified for each of the layers.

What is claimed is:

1. A method for designing a semiconductor integrated circuit having a logic macro-cell, a circular power source wiring disposed around the logic macro-cell in a ring shape and a signal wiring that traverses the circular power source wiring and is led out from the logic macro-cell to an outside, wherein at least the circular power source wiring is formed from a plurality of wiring layers, and a priority wiring direction for each of the plurality of wiring layers are specified; the method comprising:

inputting in a library definitions required for automatic placing and routing;

inputting the library and a net list defining connections between the logic macro-cell and other logic macro-cells in an automatic placing and routing apparatus;

ten determined a placement of the logic macro-cell;

ten specifying the priority wiring direction for each of the plurality of wiring layers;

then determining the circular power source wiring according to the priority wiring directions; and thereafter, determining the signal wiring according to the priority wiring directions, wherein inputting in a library definitions required for automatic placing and routing includes inputting definitions for positions of vias that mutually connect the plurality of wiring layers that form the circular power source wiring, and wherein determining a placement of the logic macro-cell includes designating an orientation of the logic macro-cell and then determining which one of the plurality of wiring layers forms the edges that compose the circular power source wiring according to the designated orientation and the priority wiring directions.

2. A method for designing a semiconductor integrated circuit according to claim 1, wherein inputting in a library definitions required for automatic placing and routing includes inputting in a library definitions for positions of vias that connect the circular power source wiring to power supply wirings that supply power from the circular power source wiring to the logic macro-cell, and wherein determining a placement of the logic macro-cell includes the step of determining which of the plurality of wiring layers are used to form the power supply wirings according to the designated orientation of the logic macro-cell and the priority wiring directions.

3. A method for designing a semiconductor integrated circuit having a logic macro-cell, a circular power source wiring disposed around the logic macro-cell in a ring shape and a signal wiring that traverses the circular power source wiring and is led out from the logic macro-cell to an outside, wherein at least the circular power source wiring is formed from a plurality of wiring layers, and a priority wiring direction for each of the plurality of wiring layers are specified, the method comprising:

inputting in a library definitions required for automatic placing and routing;

inputting the library and a net list defining corrections between the logic macro-cell and other logic macro-cells in an automatic placing and routing apparatus;

then determining a placement of the logic macro-cell;

then specifying the priority wiring direction for each of the plurality of wiring layers;

then determining the circular power source wiring according to the priority wiring directions; and thereafter, determining the signal wiring according to the priority wiring directions, wherein inputting in a library definitions required for automatic, placing and routing includes inputting in a library a definition indicating that the circular power source wiring can use any one of the plurality of wiring layers, and inputting definitions in the library for positions of vias that mutually connect the plurality of wiring layers that form the circular power source wiring, and wherein determining a placement of the logic macro-cell includes designating an orientation of the logic macro-cell, and then, according to the designated orientation and the priority wiring directions, determining the edges that form the circular power source wiring with one wiring layer selected from the determined plurality of wiring layers.

4. A method for designing a semiconductor integrated circuit according to claim 3, wherein inputting in a library definitions required for automatic placing and routing includes inputting a definition indicating that power supply wirings that supply power from the circular power source wiring to the logic macro-cell disposed therein can use any one of the plurality of wiring layers, and inputting in a library definitions for positions of vias that connect the power supply wirings and the circular power source wiring, and wherein determining a placement of the logic macro-cell includes, according to the designated orientation of the logic macro-cells and the priority wiring directions, determining to form the power supply with wiring layers selected from the determined plurality of wiring layers.

5. A method for designing a semiconductor integrated circuit, comprising:

inputting in a library definitions required for automatic placing and routing including definitions for positions of vias that mutually connect a plurality of wiring layers that form an encircling power source wiring that encircle a logic macro-cell;

inputting the library and a net list defining connections between the logic macro-cell and other logic macro-cells in an automatic placing and routing apparatus;

determining a placement of the logic macro-cell by:
designating an orientation of the logic macro-cell, and then specifying the priority wiring direction for each of the plurality of wiring layers;
then selecting one of the determined plurality of wiring layers based on the orientation designated and priority wiring directions, wherein the selected wiring layer is adapted to form the edges of the encircling power source wiring;

determining the encircling power source wiring based on the priority wiring directions; and thereafter, determining a signal wiring based on the priority wiring directions, and wherein the semiconductor integrated circuit comprises:
the logic macro-cell;
the encircling power source wiring disposed around the logic macro-cell; and
the signal wiring that traverses the encircling power source wiring and is led out from the logic macro-cell to an outside,
wherein at least the encircling power source wiring is formed from the plurality of wiring layers, and the priority wiring direction for each of the plurality of wiring layers is specified.

6. A method for designing a semiconductor integrated circuit according to claim 5, wherein inputting in a library definitions required for automatic placing and routing includes inputting in a library definitions for positions of vias that connect the encircling power source wiring to power supply wirings that supply power from the encircling power source wiring to the logic macro-cell, and wherein determining a placement of the logic macro-cell includes the step of determining which of the plurality of wiring layers are used to form the power supply wirings according to the designated orientation of the logic macro-cell and the priority wiring directions.

7. A method for designing a semiconductor integrated circuit according to claim 5, wherein the plurality of wiring layers comprise a first wiring layer extending in a first direction, and a second wiring layer extending in a second direction different that the first direction.

8. A method for designing a semiconductor integrated circuit, comprising:

inputting in a library definitions required for automatic placing and routing by:
inputting in the library a definition indicating that a encircling power source wiring can use any one of a plurality of wiring layers to encircle a logic macro-cell, and inputting definitions in the library for positions of vias that mutually connect the plurality of wiring layers that form the encircling power source wiring;

inputting the library and a net list defining connections between the logic macro-cell and other logic macro-cells in an automatic placing and routing apparatus;

determining a placement of the logic macro-cell by:
designating an orientation of the logic macro-cell, and then specifying the priority wiring direction for each of the plurality of wiring layers;
then, based on the orientation designated and the priority wiring directions, selecting one of the determining plurality of wiring layers, wherein the selected wiring layer is adapted to form the edges of the encircling power source wiring;

determining the encircling power source wiring based on the priority wiring direction and thereafter, determining the signal wiring based on the priority wiring directions, wherein the semiconductor integrated circuit comprises:
the logic macro-cell;
the encircling power source wiring disposed around the logic macro-cell in a ring shape; and
the signal wiring that traverses the encircling power source wiring and is led out from the logic macro-cell to an outside,
wherein at least the encircling power source wiring is formed from a plurality of wiring layers, and the priority wiring direction for each of the plurality of wiring layers is specified.

9. A method for designing a semiconductor integrated circuit according to claim 8, wherein inputting in a library definitions required for automatic placing and routing includes inputting a definition indicating that power supply wirings that supply power from the encircling power source wiring to the logic macro-cell disposed therein can use any one of the plurality of wiring layers, and inputting in a library definitions for positions of vias that connect the power supply wirings and the encircling power source wiring, and wherein determining a placement of the logic macro-cell includes, according to the designated orientation of the logic macro-cells and the priority wiring directions, determining to form the power supply wirings with wiring layers selected from the determined plurality of wiring layers.

10. A method for designing a semiconductor integrated circuit according to claim 8, wherein the plurality of wiring layers comprise a first wiring layer extending in a first direction, and a second wiring layer extending in a second direction different that the first direction.

11. A method of designing an integrated circuit, comprising:

inputting in a library definitions required for automatic placing and routing, wherein the library of definitions comprises (a) a definition for an encircling power source wiring that is configured to encircle a logic macro-cell, wherein the encircling power source wiring comprises either a first wiring layer or a second wiring layer, and (b) definitions for coordinates of vias that mutually connect the first wiring layer and the second wiring layer;

providing the library and a net list to an automatic placing and routing apparatus, wherein the net list defines connections between the logic macro-cell and other logic macro-cells;

determining an orientation of the logic macro-cell;

then specifying the priority wiring direction for each of the plurality of wiring layers; and routing the encircling power source wiring according to the priority wiring directions;

for each segment of the circular power source wiring and the power supply wiring, defining which one of the first wiring layer and the second wiring layer is used to form each segment of the circular power source wiring and the power supply wiring, wherein the integrated circuit comprises:
the logic macro-cell;
the encircling power source wiring disposed around the logic macro-cell in a ring shape; and
the signal wiring that traverses the encircling power source wiring and is led out from the logic macro-cell to an outside,
wherein at least the encircling power source wiring is formed from a plurality of wiring layers, and the priority wiring direction for each of the plurality of wiring layers is specified.

12. A method for designing a semiconductor integrated circuit according to claim 11, wherein, determining the orientation of the logic macro-cell, comprises:

designating an orientation of the logic macro-cell, and then, based on the orientation designated and the priority wiring directions, selecting one of the determined plurality of wiring layers, wherein the selected wiring layer is adapted to form the edges of the encircling power source wiring.

* * * * *